United States Patent
Kemerer et al.

(10) Patent No.: US 8,741,729 B2
(45) Date of Patent: Jun. 3, 2014

(54) DUAL CONTACT TRENCH RESISTOR AND CAPACITOR IN SHALLOW TRENCH ISOLATION (STI) AND METHODS OF MANUFACTURE

(71) Applicant: International Business Machines Corporation, Armonk, NY (US)

(72) Inventors: Timothy W. Kemerer, Essex Junction, VT (US); James S. Nakos, Essex Junction, VT (US); Steven M. Shank, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/939,694

(22) Filed: Jul. 11, 2013

(65) Prior Publication Data

US 2013/0292798 A1    Nov. 7, 2013

Related U.S. Application Data

(62) Division of application No. 13/114,543, filed on May 24, 2011, now Pat. No. 8,546,243.

(51) Int. Cl.
*H01L 21/20* (2006.01)
(52) U.S. Cl.
USPC .......................................... 438/386; 438/382
(58) Field of Classification Search
USPC .................................................. 438/382, 386
See application file for complete search history.

(56) References Cited

U.S. PATENT DOCUMENTS

| | | | |
|---|---|---|---|
| 6,528,383 B1 | 3/2003 | Chakravarti et al. | |
| 6,717,071 B2 | 4/2004 | Chang et al. | |
| 6,784,045 B1 | 8/2004 | Price et al. | |
| 7,190,592 B2 | 3/2007 | Hu | |
| 7,355,267 B2 | 4/2008 | Kirby et al. | |
| 7,759,189 B2 | 7/2010 | Kemerer et al. | |
| 7,897,473 B2 | 3/2011 | Kemerer et al. | |
| 2007/0158725 A1 | 7/2007 | Cheng et al. | |
| 2010/0025813 A1 | 2/2010 | Kemerer et al. | |
| 2010/0025814 A1 | 2/2010 | Kemerer et al. | |
| 2011/0084360 A1 | 4/2011 | Kemerer et al. | |

FOREIGN PATENT DOCUMENTS

JP       11330375      11/1999

OTHER PUBLICATIONS

U.S. Appl. No. 13/025,501, filed Feb. 11, 2011.

*Primary Examiner* — Douglas Menz
(74) *Attorney, Agent, or Firm* — Richard Kotulak; Roberts Mlotkowski Safran & Cole, P.C.

(57) ABSTRACT

A resistor and capacitor are provided in respective shallow trench isolation structures. The method includes forming a first and second trench in a substrate and forming a first insulator layer within the first and second trench. The method includes forming a first electrode material within the first and second trench, on the first insulator layer, and forming a second insulator layer within the first and second trench and on the first electrode material. The method includes forming a second electrode material within the first and second trench, on the second insulator layer. The second electrode material pinches off the second trench. The method includes removing a portion of the second electrode material and the second insulator layer at a bottom portion of the first trench, and filling in the first trench with additional second electrode material. The additional second electrode material is in electrical contact with the first electrode material.

14 Claims, 9 Drawing Sheets

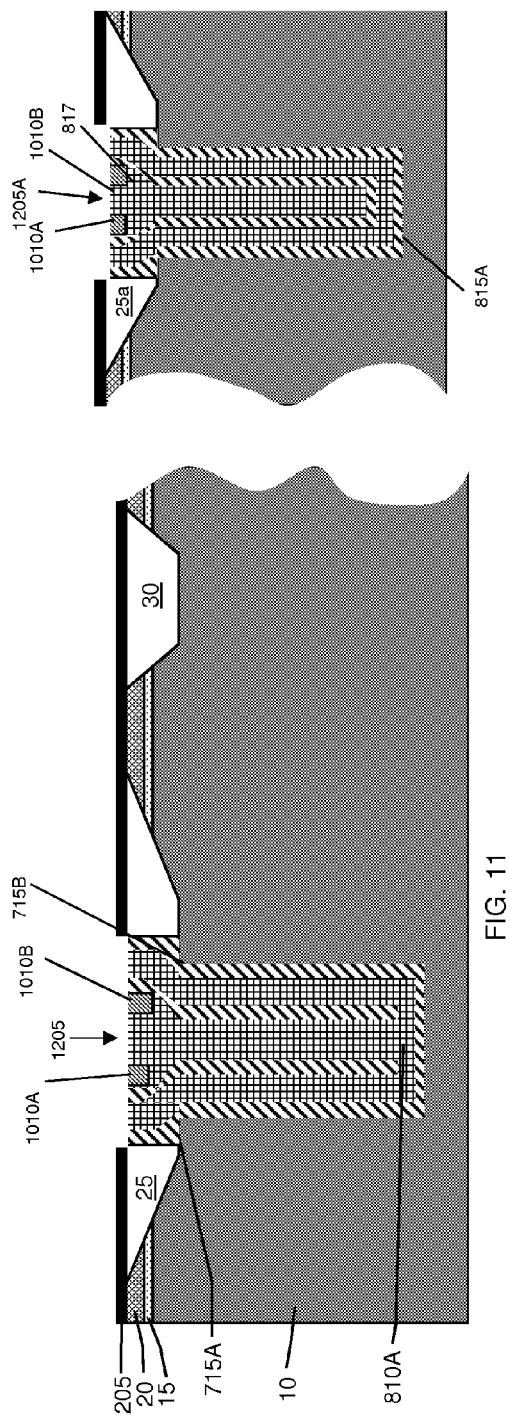
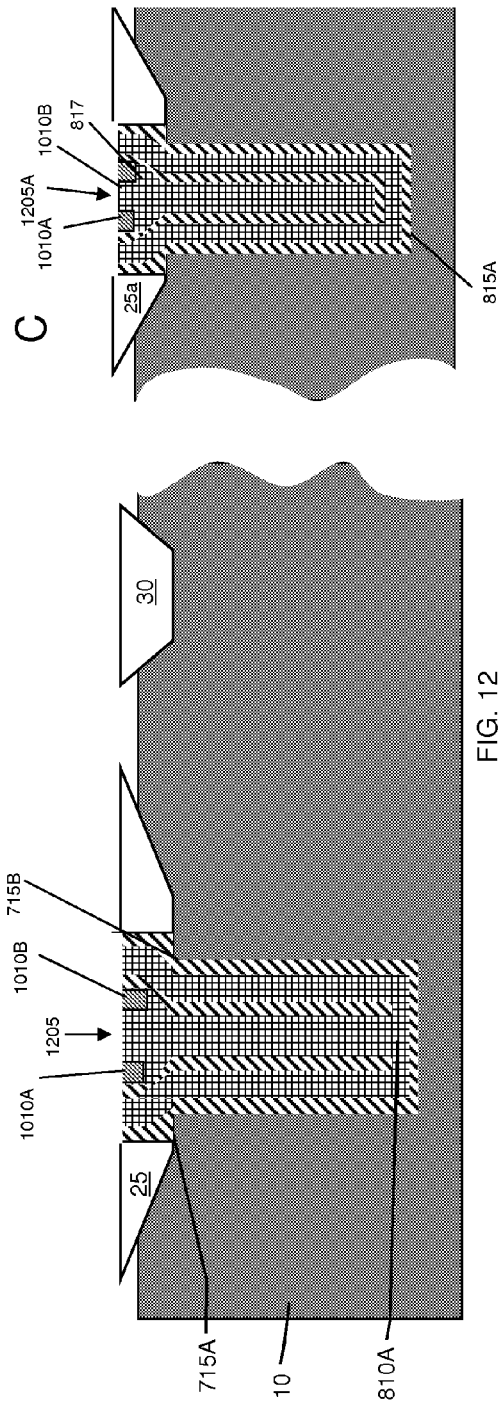
FIG. 11
FIG. 12

DUAL CONTACT TRENCH RESISTOR AND CAPACITOR IN SHALLOW TRENCH ISOLATION (STI) AND METHODS OF MANUFACTURE

FIELD OF THE INVENTION

The invention relates to semiconductor structures and methods of manufacture and, more particularly, to a dual contact trench resistor and capacitor in shallow trench isolation (STI) structures and methods of manufacture.

BACKGROUND

The use of resistors and capacitors in combination is common in current integrated circuits. These integrated circuits include resonant circuits and "system-on-chip" circuits that integrate analog, digital, and passive devices on a semiconductor substrate. As performance requirements of semiconductor devices increase, and dimension requirements of such devices decrease, resistors and capacitors also require greater performance and lesser dimensions.

However, structures such as planar resistors and metal-insulator-metal (MIM) capacitors cannot achieve these requirements of increasing capacitance or resistance while minimizing dimensions, without using exotic materials and/or larger-area semiconductor devices. Further, resistor and capacitor components need to be radiation-hardened to withstand radiation events, e.g., harden static random access memory (SRAM).

Accordingly, there exists a need in the art to overcome the deficiencies and limitations described hereinabove.

SUMMARY

In a first aspect of the invention, a method comprises forming a first trench and a second trench in a substrate. The method further comprises forming a first insulator layer within the first trench and the second trench. The method further comprises forming a first electrode material within the first trench and the second trench, on the first insulator layer, and isolated from the substrate by the first insulator layer. The method further comprises forming a second insulator layer within the first trench and the second trench and on the first electrode material. The method further comprises forming a second electrode material within the first trench and the second trench, on the second insulator layer, and isolated from the substrate by the first insulator layer and the second insulator layer. The second electrode material pinches off the second trench. The method further comprises removing a portion of the second electrode material and the second insulator layer at a bottom portion of the first trench. The method further comprises filling in the first trench with additional second electrode material such that the additional second electrode material is in electrical contact with the second electrode material and the first electrode material.

In another aspect of the invention, a method comprises forming a deep trench through an STI structure and an underlying substrate. The method further comprises forming a first insulator material on a sidewall and bottom of the deep trench. The method further comprises forming a first electrode layer on the first insulator material, within the deep trench. The method further comprises forming a second insulator material on the first electrode layer. The method further comprises removing a portion of the second insulator material at a bottom of the deep trench to expose the first electrode layer. The method further comprises forming a second electrode layer in the deep trench on the second insulator material, and in electrical contact with the first electrode layer. The method further comprises forming a third insulator layer on the second electrode layer, in the deep trench. The method further comprises forming a third electrode layer in the deep trench on the third electrical layer.

In yet another aspect of the invention, a structure comprises a trench formed in a semiconductor substrate. The structure further comprises a resistor formed in the trench. The structure further comprises a capacitor formed in the trench. The resistor and the capacitor are coaxially located with respect to one another. The capacitor and the resistor are both electrically isolated from the substrate. The resistor and capacitor are formed within a shallow trench isolation (STI) region.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the dual contact trench resistor and capacitor in STI, which comprises the structures of the present invention. In still further embodiments, a method in a computer-aided design system is provided for generating a functional design model of the dual contact trench resistor and capacitor in STI. The method comprises generating a functional representation of the structural elements of the dual contact trench resistor and capacitor in STI.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-14 show processing steps and respective structures in accordance with aspects of the invention;

DETAILED DESCRIPTION

The invention relates to semiconductor structures and methods of manufacture and, more particularly, to a dual contact trench resistor and capacitor in shallow trench isolation (STI) structures and methods of manufacture. More specifically, the invention is directed to coaxial, isolated resistor and capacitor structures. The coaxial, isolated resistor includes a high resistance value and at least two independent, contactable electrodes isolated laterally and vertically from a substrate or well and from each other. Similarly, the coaxial, isolated capacitor includes a high capacitance value and at least two independent, contactable electrodes isolated laterally and vertically from a substrate or well and from each other. In embodiments, the resistor and capacitor structures of the present invention are formed in same processing steps, in the same or respective deep trench isolation structures. In one embodiment, the resistor is formed in a vertical deep trench that has a larger cross section or diameter than the vertical deep trench used to form the capacitor.

Also, advantageously, the structures of the present invention include reduced dimensions compared to, for example, backend planar resistor and capacitor structures. Further, the structures (e.g., resistor and capacitor structures) of the invention include doped polysilicon materials instead of more exotic materials required in the backend planar resistor or capacitor structures. The polysilicon materials can, for example, achieve high range of resistance values and high range of high capacitance values. In addition, the invention allows for a smaller, radiation-tolerant or radiation-hardened (rad-hard) SRAM design by providing more resistance and capacitance per unit area than the backend planar resistor and capacitor structures, respectively, which in turn allows for more compact cell designs.

Figure 1:
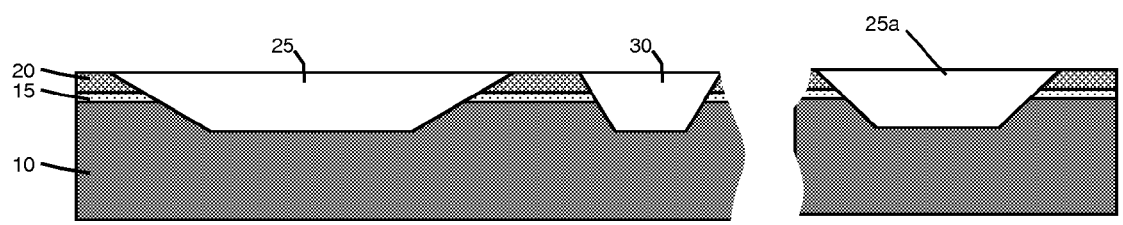

FIG. 1 shows processing steps and a respective structure in accordance with aspects of the invention. The structure includes a substrate 10 (e.g., a wafer body) that, in embodiments, may include any bulk substrate, such as silicon. A hard mask pad film 15 is formed over and directly in contact with the substrate 10, and may include an oxide. The film 15 may be formed through any conventional oxidation process or a chemical vapor deposition (CVD) process. In one illustrative, non-limiting example, the oxide film 15 may include a thickness of approximately 10-500 Å (ångströms), and more specifically between 10-100 Å, and even more specifically 10-50 Å; although other dimensions are contemplated by the invention.

Still referring to FIG. 1, a hard mask or pad film 20 is formed over and directly in contact with the film 15, and in embodiments, may include a nitride or other material that can be selectively removed during subsequent etching processes. The film 20 may be formed through a CVD process, and may include a thickness of approximately 50-3,000 Å, and preferably approximately 500-1,200 Å; although other thickness are also contemplated by the invention. Shallow trench isolation (STI) structures 25, 25a and 30 are simultaneously formed into the films 15, 20 and the substrate 10 through a process including, for example, conventional lithography \and deposition processes. For example, a resist can be formed on the film 20 and exposed to light to form openings. A Reactive Ion Etch (RIE), for instance, can then form trenches in the structure, e.g., through the films 20, 15 and into the substrate 10. The trenches can then be filled with insulative materials. In embodiments, each of the STI structures 25, 25a and 30 may include an oxide, for example. A surface of the structure can then be planarized using a chemical mechanical polishing (CMP).

Figure 2:
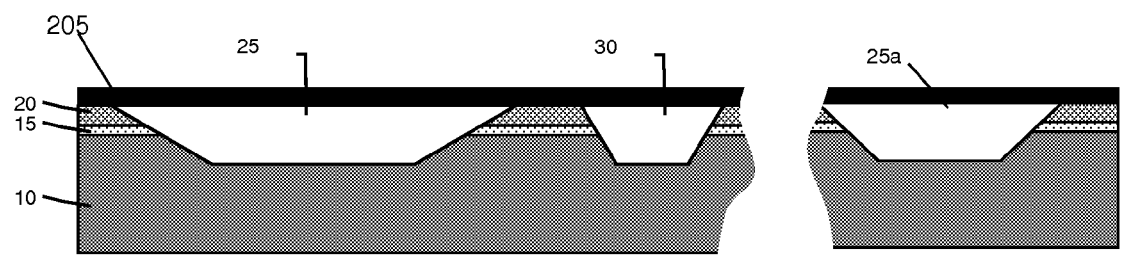

Referring to FIG. 2, a nitride cap 205 is formed over and directly in contact with the film 20 and the STI structures 25, 25a, 30. In embodiments, the nitride cap 205 may include a thickness of approximately 50-3,000 Å with a preferable thickness of approximately 50-1,200 Å; although other thicknesses are also contemplated by the invention. The nitride cap 205 may be deposited using conventional CVD processes.

Figure 3:
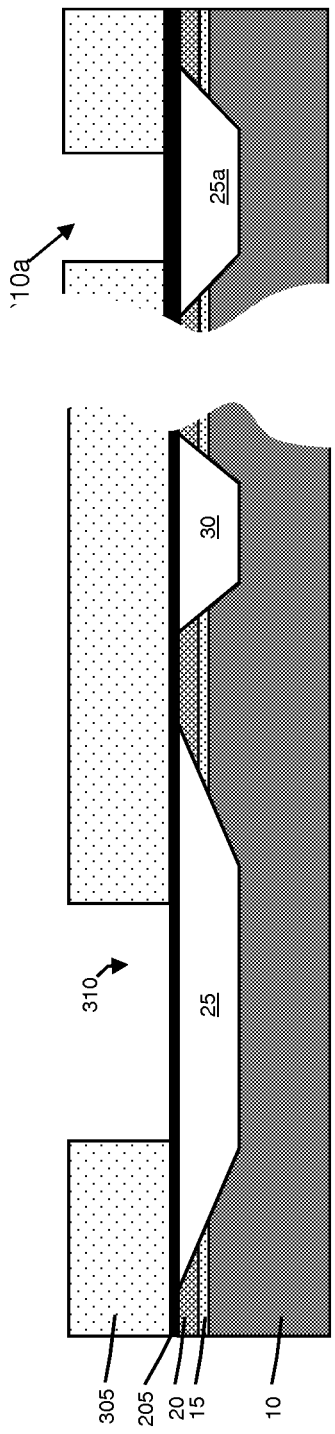

Referring to FIG. 3, a photoresist layer 305 is formed over and directly in contact with the nitride cap 205. In embodiments, the photoresist layer 305 may be deposited using any conventional deposition process, such as a spin-on process and/or a CVD. In embodiments, openings 310 and 310a are formed into the photoresist layer 305 via a photolithographic process (e.g., an expose and develop process). The opening 310 is aligned with the underlying STI structure 25; whereas, the opening 310a is aligned with the underlying STI structure 25a.

Figure 4:
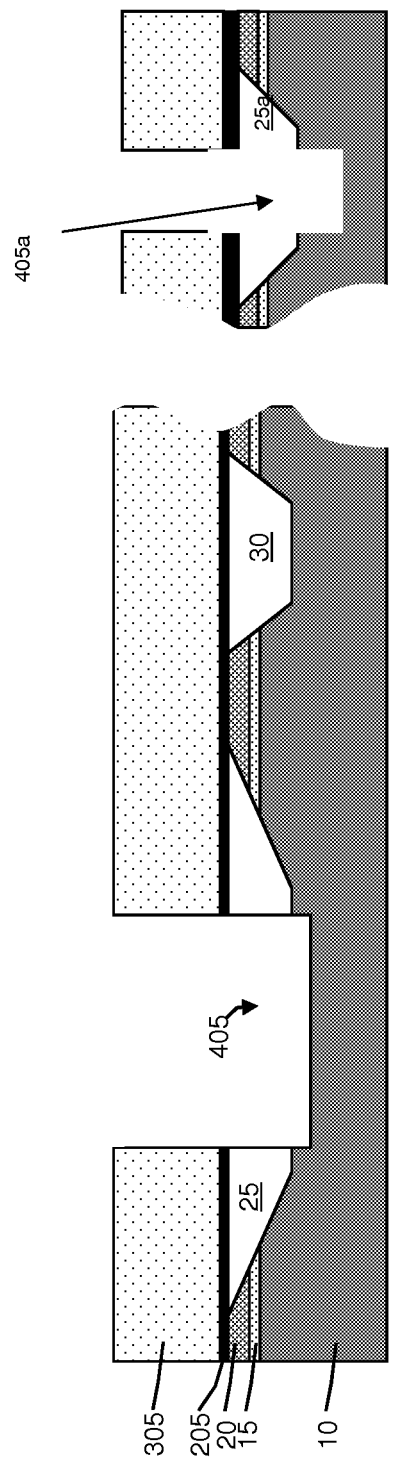

Referring to FIG. 4, trenches 405 and 405a are formed into the nitride cap 205, the STI structures 25, 25a (respectively) and the substrate 10 using a conventional etching process. For example, the trenches 405, 405a can be simultaneously formed by a conventional RIE process. In embodiments, the trenches 405, 405a extend into the substrate 10. In embodiments, the trench 405 (and, in embodiments, trench 405a) may have a diameter or cross section of about 0.85 µm, although other dimensions are also contemplated by the present invention. The photoresist layer 305 is later removed.

Figure 5:
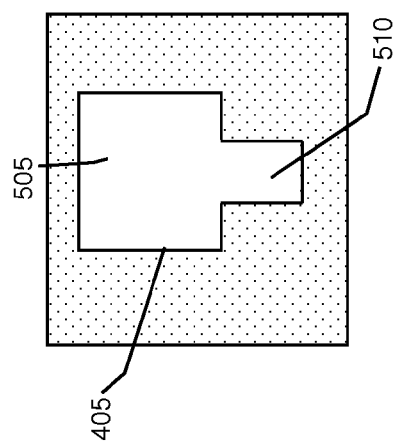

FIG. 5 shows a top view of the trench 405 formed in FIG. 4. As shown in FIG. 5, a shape of the trench 405 is a "T" shape, including a wide section 505 and a narrow section 510. In embodiments, the trench 405 may include a length of approximately 0.85 µm, the wide section 505 may include a width of approximately 0.64 µm, and the narrow section 510 may include a width of approximately 0.21 µm; although other dimensions are contemplated by the present invention. The top view of FIG. 5 can also be representative of the trench 405a.

Figure 6:
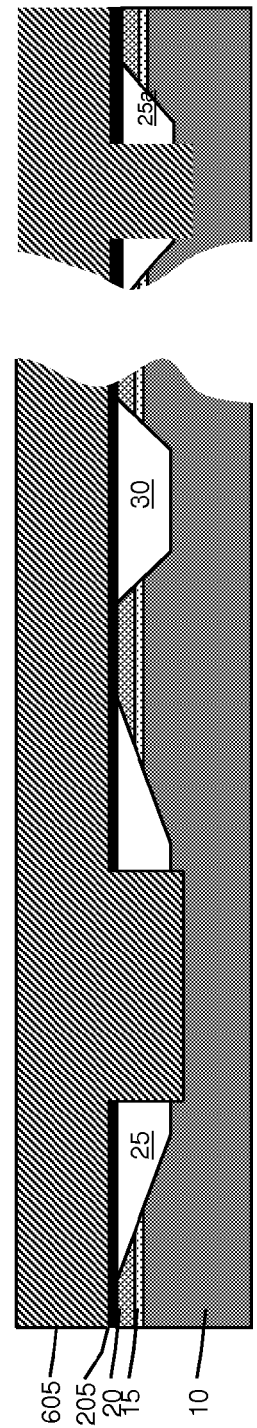

Referring to FIG. 6, the photoresist layer 305 is stripped, and an insulator layer 605 is deposited in the trenches 405, 405a, and on the nitride cap 205. In embodiments, the insulator layer 605 is a boron-doped silicate glass (BSG) layer 605 formed over and directly in contact with the nitride cap 205 and into the trenches 405, 405a. The insulator layer 605 can be deposited using any conventional deposition process. It should be understood that a thickness of the layer 605 can be adjusted based on the design of the structure of the invention.

Figure 7:
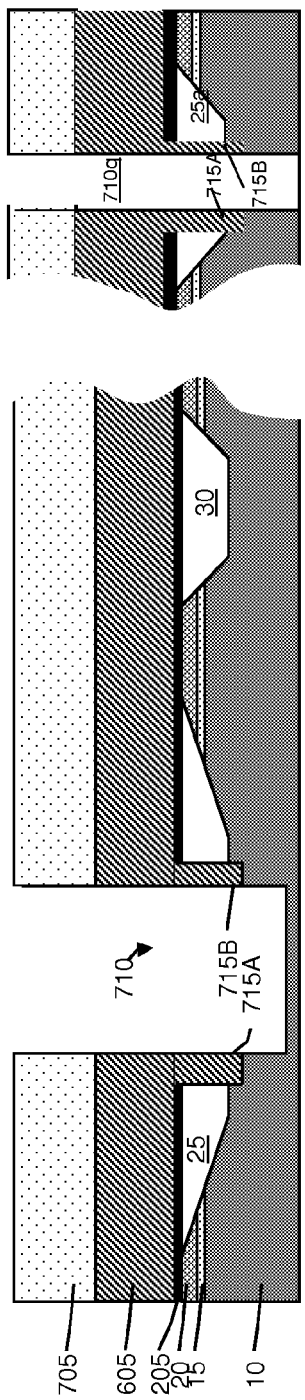

Referring to FIG. 7, a photoresist layer 705 is formed over and directly in contact with the layer 605, using any conventional deposition process. In embodiments, an opening may be formed into the photoresist layer 705 via a photolithographic process (e.g., an expose and develop process), which is aligned (e.g., coincident) with the underlying STI structures 25, 25a, and more specifically with the filled trenches 405, 405a. Using a conventional etching process, deep trenches 710 and 710a are simultaneously formed through the layer 605 and into the substrate 10. More specifically, the trench 710 is formed within the layer 605 formed within the trench 405; whereas, the trench 710a is formed within the layer 605 formed within the trench 405a. The layer 605 will form shoulders 715A and 715B approximately near a junction of the STI 25 and STI 25a, and the substrate 10 during a subsequent etch process.

In embodiments, the vertical trenches 710, 710a may extend approximately 5-10 microns below a surface of the substrate 10; although other depths are also contemplated by the present invention. This vertical depth may be adjusted to set a resistance of the resistor and capacitance of the capacitor, and is independent of any other layer that forms the resistor or capacitor. In embodiments, the trench 710 will be used to form a resistor and the trench 710a will be used to form a capacitor, during same processing steps.

In order to accomplish the advantages of the present invention, the trenches 710 and 710a are formed with different cross sectional dimensions, i.e., different cross sections or diameters. For example, the trench 710a will have a smaller diameter or cross section than the trench 710. In this way, material will pinch off the trench 710a during material deposition processes within both the trench 710 and 710a. By having such a pinch off in trench 710a, insulator layers between the plates of the capacitor can be protected during etching steps to form the resistor, as discussed in more detail below.

Figure 8:
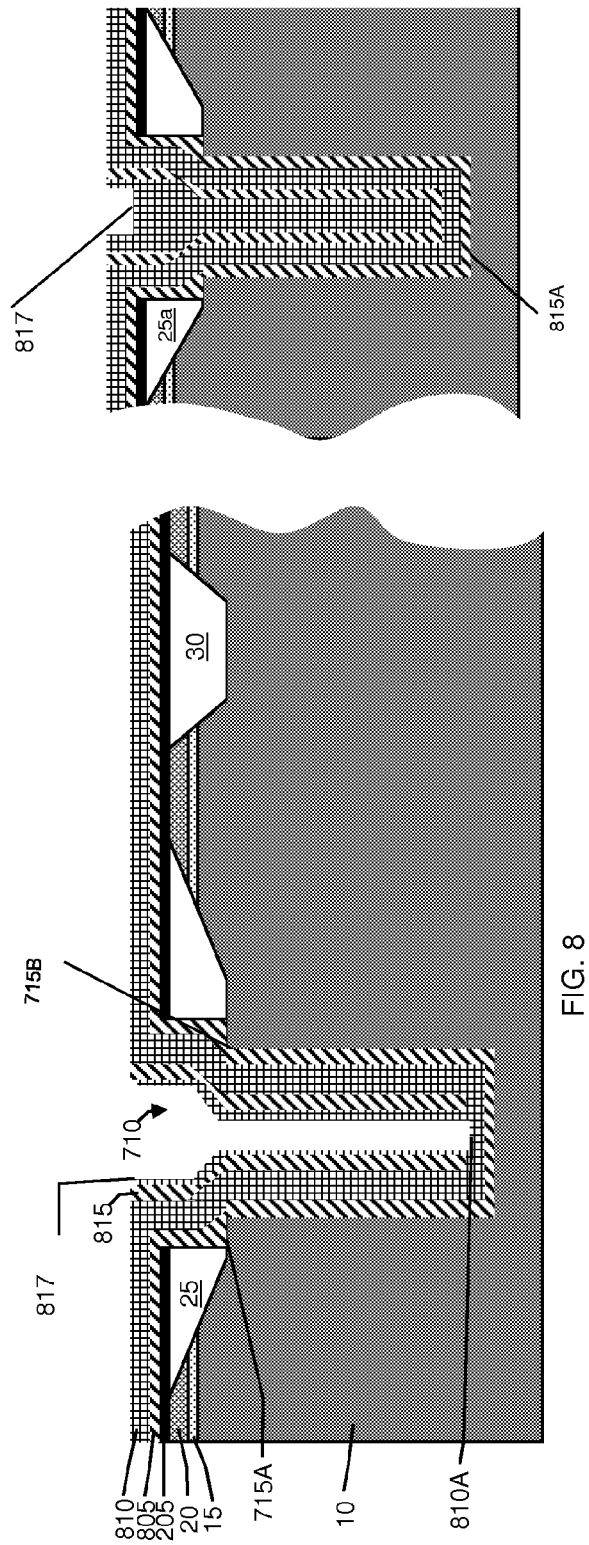

Referring to FIG. 8, the layer 605 and the photoresist layer 705 are removed, using conventional processes. For example, in embodiments, the photoresist layer 705 may be removed during the etching process that formed the trenches 710, 710a. The layer 605 may be removed using a wet etching process, with the underlying nitride cap 205 acting as an etch stop layer. This etching step also removes the layer 605 formed on the shoulders 715A, 715B. In this etching process, the nitride cap 205 may be slightly thinned.

Still referring to FIG. 8, a series of layers 805, 810, 815 and 817 are formed (deposited) over and directly in contact with the structure, preferably within the trenches 710, 710a and on the shoulders 715A, 715B, using any conventional deposition process. In embodiments, layer 805 may be an oxide layer, such as, for example, an oxynitride oxide layer. The oxynitride oxide layer 805 may act as an insulator layer, insulating the layer 810 from the substrate 10. The insulator layer 805 may be about 20 nm in thickness; although the insulator layer 805 can be other dimensions contemplated by the present invention. The insulator layer 805 may be formed with a slope at or near the shoulders 715A, 715B, such that the insulator layer 805 is greater in thickness in its sloped regions than in its vertical regions. In embodiments, the insulator layer 805 may be formed with a slope of approximately 60°-80°, with a preferable slope of approximately 70°; although other slopes are also contemplated by the invention.

Still referring to FIG. 8, in embodiments, layer 810 may be a polysilicon layer that can be lightly-doped with arsenic and which is formed over and directly in contact with the insulator layer 805. The polysilicon layer 810 acts as a first electrode of the resistor of the invention. In embodiments, the polysilicon layer 810 also acts as a plate for the capacitor.

The polysilicon layer 810 may be about 100 nm in thickness; although other dimensions are contemplated by the present invention in order to tune a resistance or capacitance between the insulator layer 805 and the overlying polysilicon layer 810. The polysilicon layer 810 may be formed with a slope at or near the shoulders 715A, 715B, such that the polysilicon layer 810 is greater in thickness in its sloped regions than in its vertical regions. In embodiments, the polysilicon layer 810 may be formed with a slope of approximately 60°-80°, with a preferable slope of approximately 70°; although other slopes are also contemplated by the invention.

In embodiments, layer 815 may be a second insulator layer such as oxide or oxynitride oxide layer, which is formed over and directly in contact with the polysilicon layer 810. The second insulator layer 815 acts as an insulator layer, insulating portions of the polysilicon layer 810. The insulator layer 815 may be about 7 nm in thickness; although other dimensions are also contemplated by the present invention. The insulator layer 815 may be formed with a slope at or near the shoulders 715A, 715B, such that the insulator layer 815 is greater in thickness in its sloped region than in its vertical region. In embodiments, the insulator layer 815 may be formed with a slope of approximately 60°-80°, with a preferable slope of approximately 70°; although other slopes are also contemplated by the invention. A polysilicon layer 817 may be formed on the insulator layer 815, which will effectively pinch off the trench 710a due to its smaller cross section or diameter. In embodiments, the polysilicon layer 817 can be lightly-doped with arsenic.

In embodiments, in the trench 710, the insulator layer 815 and polysilicon layer 817 can be etched (e.g., anisotropic etch), to expose the underlying layer 810 on the surface of the structure, at a bottom 810A of the trench 710. Insulator coverage remains on sidewalls of the trench 710 due to dimensional coverage (e.g., additional thickness presented with the layer 817) on the sloped sidewalls, resulting from the layers 805, 810, 815, 817 being formed with the slopes at or near the shoulders 715A, 715B and the layers 810, 815 being formed with additional thickness at their sloped regions, and layer 817 providing added thickness and protection. The additional thickness of the sloped insulator layer 815 at the shoulders 715A, 715B (and the use of the layer 817) before etching allows the polysilicon layer 810 to be exposed at the bottom 810A, while the insulator layer 815 (and the layer 817) remains intact. Also, the pinched off layer 817 in the trench 710a, prevents etching of the bottom 815A of the trench 710a.

In embodiments, the width of the trench 710 has a minimum width to ensure that the layers 805, 810, 815, 817 do not pinch off the trench 710; compared to that of the trench 710a. That is, the dimensional width of the trench 710 will not result in a pinch-off; whereas, the dimensional width of the 710a, being smaller than that of the trench 710, will result in pinch off during deposition of the layer 817. This will ensure that the material at the bottom portion 815A of the trench 710a is not etched during the etching processes of the trench 710, thereby resulting in a capacitor.

Figure 9:
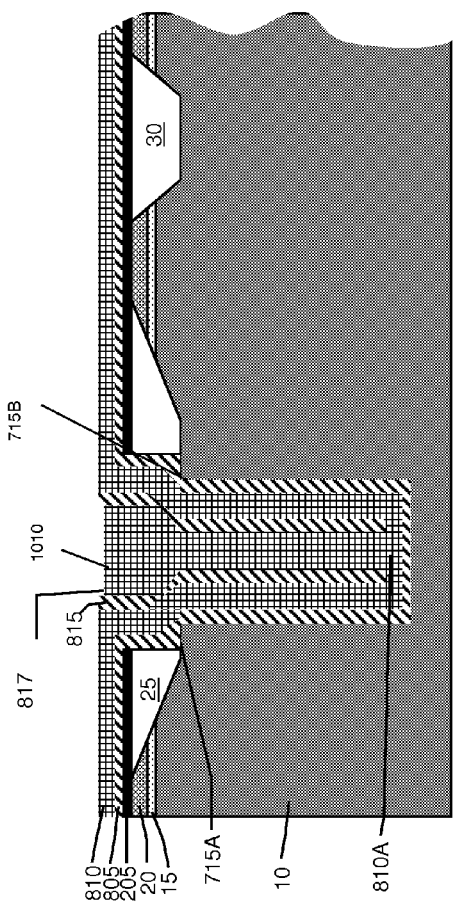
Figure 9:
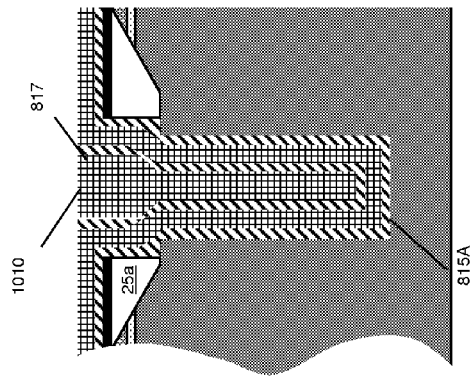

Referring to FIG. 9, a polysilicon layer 1010 is formed over and directly in contact with the second polysilicon layer 817, within the trench 710, which makes contact with the polysilicon layer 810 of the bottom exposed portion 810A. In this way, the polysilicon layer 1010 is in physical and electrical contact with the polysilicon layer 810 at the bottom exposed portion 810A, within the trench 710; however, as the polysilicon layer 817 causes the pinch off in the trench 710a, polysilicon layer 1010 will only fill in a slight recess over the polysilicon layer 817, which was caused by the conformal deposition of the polysilicon layer 817 in the trench 710a. The polysilicon layer 1010 can be slightly-doped with arsenic and acts as a second electrode of the resistor of the invention. Similarly, the polysilicon layer 817 and/or layer 1010 will act as an electrode for the capacitor of the invention.

In embodiments, the polysilicon layer 1010 may be about 200 nm in thickness; although other dimensions are also contemplated by the present invention. In embodiments, a resistance may be generated between the two polysilicon layers 810, 1010. In further embodiments, a capacitance can be generated between the polysilicon layers 805, 810, 817 (or any portion of deposited layer 1010) of the capacitor.

Still referring to FIG. 9, in embodiments, the polysilicon layers 810, 817, 1010 may be formed of a polysilicon, a metal, or a metal silicide. In any scenario, the polysilicon layers 810, 817, 1010 form electrodes for the coaxial resistor and capacitor of the invention. Also, in embodiments, metal contacts are formed on exposed regions of the electrodes (see, for example, representative FIG. 16). In embodiments, more specifically, the polysilicon layer 1010 is exposed on an upper surface of the structure to form a contact region, with regard to both trenches 710, 710a. The lower polysilicon layer 810 is an independent electrode, isolated from the wafer body (e.g., the substrate 10) both laterally and vertically. In this manner, electron hole pairs created by, for example, radiation or other unwanted charging events, are not swept to the first electrode (e.g., the lower polysilicon layer 810) as it is isolated from the wafer body. As such, the electrons hitting the wafer body do not disrupt the resistor or capacitor. The layers 805, 810, 815, 817 and 1010 may be changed and/or adjusted (e.g., in material and/or thickness) to set a resistance of the resistor or capacitance of the capacitor of the invention.

Figure 10:
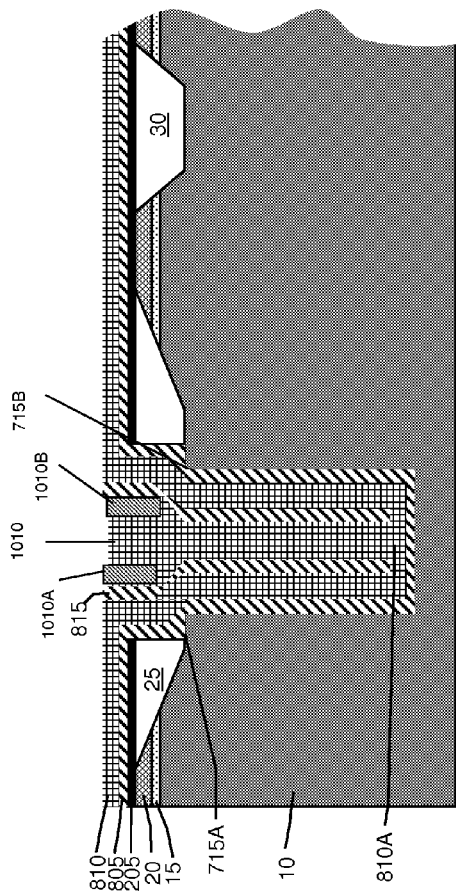
Figure 10:
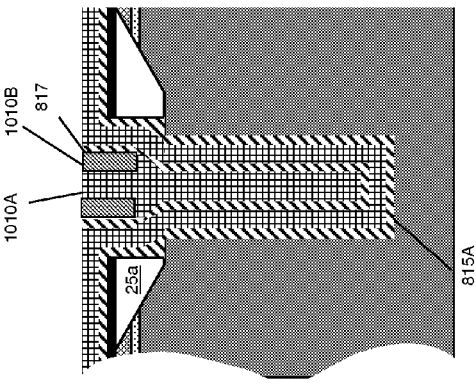

In FIG. 10, as an optional embodiment, the top polysilicon layer 1010 (and/or portions of the layer 817) may be etched away using a conventional etching process, which results in a hole. The hole may then be filled with a dielectric material such as, for example, an oxide. A portion of the oxide (e.g., a central portion) may then be etched away using a conventional directional etching process to form sidewall spacers 1010A and 1010B. The sidewall spacers 1010A, 1010B add margins to effectively eliminate any potential short circuits of the resistor of the invention. An open space between the sidewall spacers 1010A, 1010B may then be filled with additional polysilicon material 1010, which is planarized through conventional processes.

In FIG. 10, portions of the layers 805, 810, 815, 817, 1010 and the sidewall spacers 1010A, 1010B deposited on the nitride cap 205 are etched or polished away using a conventional etching or polishing process. In embodiments, the nitride cap 205 may act as an etch stop layer for this process.

Referring to FIG. 11, the layers 805, 810, 815, 817, 1010 and the sidewall spacers 1010A, 1010B are etched to form a recess 1205 within the STI structure 25 and a recess 1205A within the STI structure 25a. In embodiments, the layers may be etched to about half of a depth of the combination of nitride cap 205 and the films 20, 15. In embodiments, the polysilicon layers 810, 1010 (and perhaps any exposed portions of layer 817, depending on dimensions of the structure) may be etched away using a conventional etch process, while the insulator layers 805, 815 may be removed using a deglaze process utilizing a HFEG (hydrofluoric acid diluted by ethylene glycol) solution.

In FIG. 12, the nitride cap 205 and the pad film 20 are removed using a hot phosphoric removal process, such that the STI structures 25, 25a, 30 are higher than the oxide film 15. In this way, the layers 805, 810, 815, 817 and 1010 and the sidewall spacers 1010A, 1010B are above the surface of the substrate 10. The oxide film 15 is also removed using, for example, an HF process. The HF process removes portions of the oxide fill in the STI structures 25, 25a, 30, but only slightly impacts the insulator layers 805, 815. In this way, a resistor "R" and a capacitor "C" can be formed simultaneously, in deep trench structures.

Figure 13:
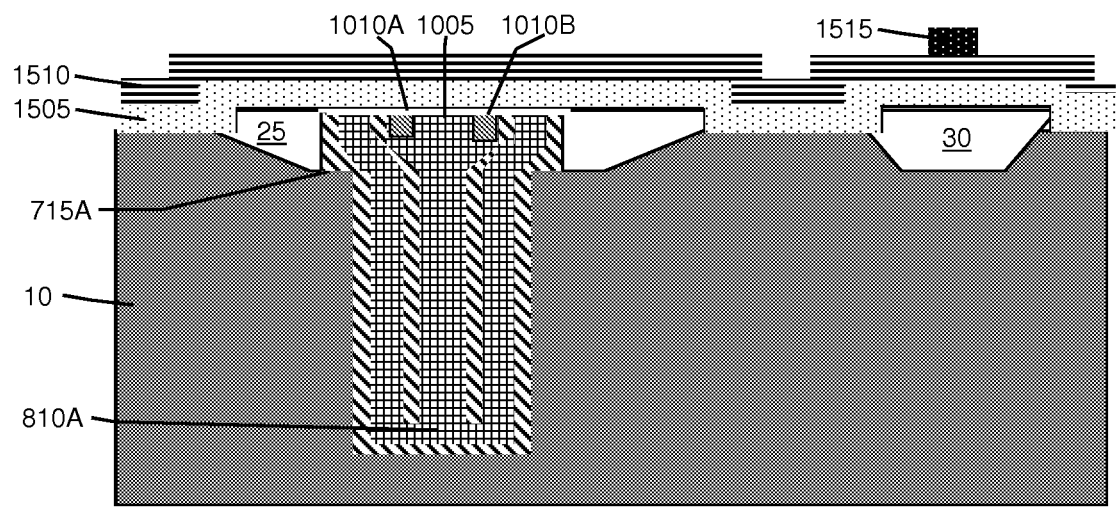
Figure 14:
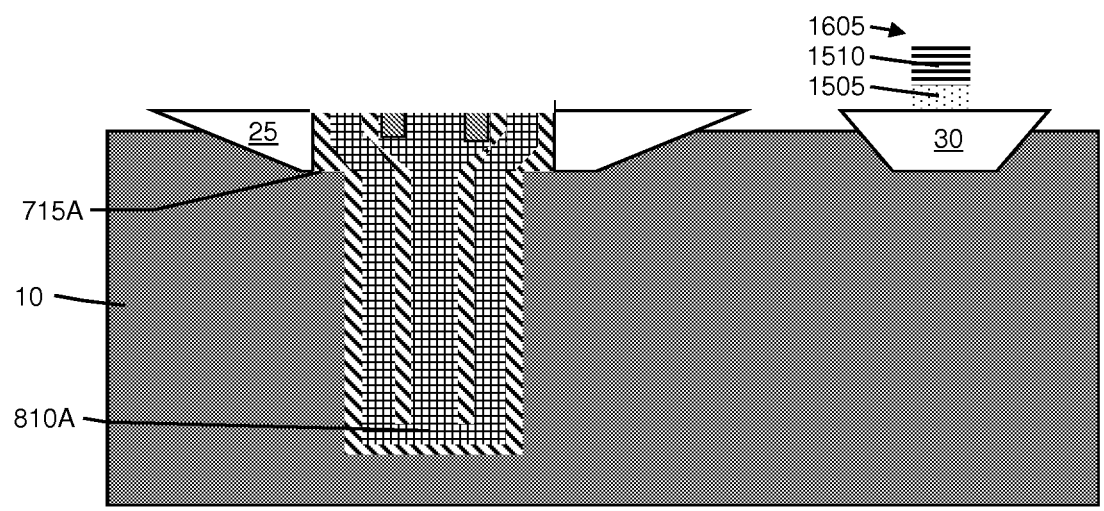

FIGS. 13-14 show processing through a formation of a gate structure. In FIG. 13, in embodiments, an oxide or other dielectric material 1505 may be deposited on the surface of the structure. A polysilicon conductor material 1510 may be deposited over and directly in contact with the oxide layer 1505. A mask 1515 is then deposited and patterned in areas of gate formation using a conformal deposition process. Thereafter, the polysilicon material 1510 and the oxide material 1505 are etched using a conventional etching process. In this way, as shown in FIG. 14, a vertical gate structure 1605 may be formed from the oxide material 1505 and polysilicon conductor material 1510. Additionally, gate sidewalls and spacers, for example, can also be formed using conventional processes.

Figure 15:
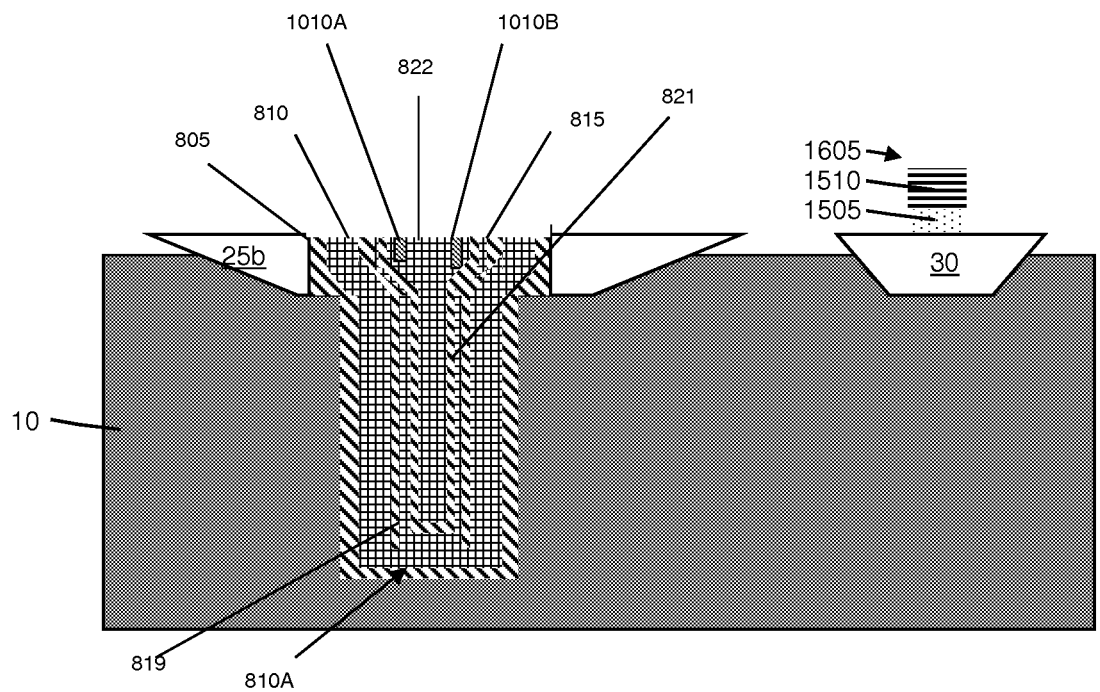
FIGS. 15-16 show processing steps and respective structures in accordance with additional aspects of the invention.
Figure 16:
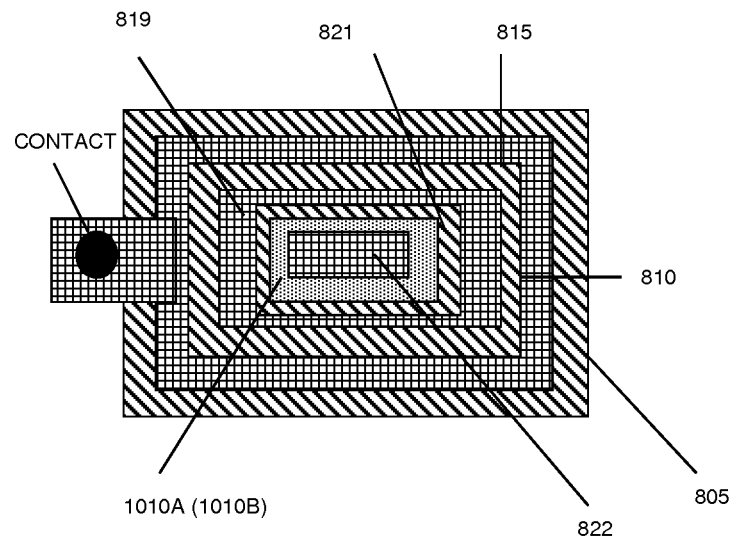

FIGS. 15-16 show structures and respective processes for fabricating structures in accordance with additional aspects of the invention. More specifically, FIGS. 15 and 16 show the formation of concentrically formed resistor and capacitor structures, formed in a single deep trench structure. That is, in FIGS. 15 and 16, the resistor and capacitor structures are formed about a same axis, in a single deep trench structure. More specifically, FIGS. 15 and 16 show a trench formed in a semiconductor substrate, with a resistor and a capacitor formed in the trench. The resistor and the capacitor are coaxially located with respect to one another, and the capacitor and the resistor are both electrically isolated from the substrate. The resistor and capacitor are formed within a shallow trench isolation (STI) region.

Similar to that described above, in this structure, a hard mask or pad film is formed over and directly in contact with an underlying film, and in embodiments, may include a nitride or other material that can be selectively removed during subsequent etching processes. The dimensions and processes for forming the films are discussed above. A shallow trench isolation (STI) structure 25b is formed into the films and the substrate 10 through a process including, for example, conventional lithography etching and deposition processes. A nitride cap is formed over and directly in contact with the top film and the STI structure 25b.

A photoresist layer is formed over and directly in contact with the nitride cap. An opening is aligned with the underlying STI structure and a trench is formed into the nitride cap, the STI structure and the substrate 10 using a conventional etching process. The photoresist layer is stripped, and an insulator layer is deposited in the trench and on the nitride cap. The insulator layer can be a boron-doped silicate glass (BSG) layer formed over and directly in contact with the nitride cap and into the trench.

A photoresist layer is formed over and directly in contact with the BSG layer, using any conventional deposition process. In embodiments, an opening may be formed into the photoresist layer via a photolithographic process (e.g., an expose and develop process), which is aligned (e.g., coincident) with the underlying STI structure 25b and more specifically with the filled trench. Using a conventional etching process, a deep trench is formed through the BSG layer and into the substrate 10. In embodiments, the trench has a dimension that will allow the formation of both a resistor and capacitor structure therein. In embodiments, the vertical trench may extend approximately 5-10 microns below a surface of the substrate 10; although other depths are also contemplated by the present invention. This vertical depth may be adjusted to set a resistance or capacitance, as discussed above. The BSG layer and the photoresist layer are removed, using conventional processes.

Still referring to FIGS. 15 and 16, a series of layers 805, 810, 815 are formed (deposited) over and directly in contact with the structure, preferably within the trench and on shoulders, using any conventional deposition process. In embodiments, layer 805 may be an oxide layer, such as, for example, an oxynitride oxide layer which may act as an insulator layer, insulating the layer 810 from the substrate 10. The insulator layer 805 may be about 20 nm in thickness; although the insulator layer 805 can be other dimensions contemplated by the present invention. Layer 810 may be a polysilicon layer which acts as a first electrode of the resistor of the invention. The polysilicon layer 810 may be about 100 nm in thickness; although other dimensions are contemplated by the present invention in order to tune a resistance between the insulator layer 805 and the overlying polysilicon layer 810. In embodiments, the polysilicon layer 810 may be formed with a slope of approximately 60°-80°, with a preferable slope of approximately 70'; although other slopes are also contemplated by the invention.

In embodiments, layer 815 may be a second insulator layer such as oxide or oxynitride oxide layer, formed over and directly in contact with the polysilicon layer 810. The insulator layer 815 acts as an insulator layer, insulating portions of the polysilicon layer 810. The insulator layer 815 may be about 7 nm in thickness; although other dimensions are also contemplated by the present invention. The insulator layer 815 may be formed with a slope at or near the shoulders, such that the insulator layer 815 is greater in thickness in its sloped region than in its vertical region. In embodiments, the insulator layer 815 may be formed with a slope of approximately 60°-80°, with a preferable slope of approximately 70°; although other slopes are also contemplated by the invention.

In embodiments, in the trench, the insulator layer 815 can be etched (e.g., anisotropic etch), to expose the underlying polysilicon layer 810 on the surface of the structure and at a bottom 810A of the trench. Insulator coverage remains on sidewalls of the trench due to dimensional coverage on the sloped sidewalls.

A polysilicon layer 819 is formed over and directly in contact with the second polysilicon layer 810, within the trench. The polysilicon layer 819 makes contact with the polysilicon layer 810 at the bottom exposed portion 810A. In this way, the polysilicon layer 819 is in physical and electrical contact with the polysilicon layer 810 at the bottom exposed portion 810A, within the trench. In embodiments, the polysilicon layer 819 may be about 200 nm in thickness; although other dimensions are also contemplated by the present invention. In embodiments, a resistance may be generated between the two polysilicon layers 810, 819.

Still referring to FIGS. 15 and 16, to form the capacitor, a third insulator layer 821, e.g., oxide or oxynitride oxide layer, is formed over and directly in contact with the polysilicon layer 819. The insulator layer 821 acts as an insulator layer, insulating portions of the polysilicon layer 819. The insulator layer 821 may be about 7 nm in thickness; although other dimensions are also contemplated by the present invention. A polysilicon layer 822 fills the remaining portion of the trench, over the insulator layer 821. In embodiments, the polysilicon layers may be formed of a polysilicon that is lightly-doped with arsenic, a metal, or a metal silicide.

Still referring to FIGS. 15 and 16, as an optional embodiment, the top polysilicon layer 822 may be etched away using a conventional etching process, which results in a hole. The hole may then be filled with a dielectric material such as, for example, an oxide. A portion of the oxide (e.g., a central portion) may then be etched away using a conventional directional etching process to form sidewall spacers 1010A and 1010B. The sidewall spacers 1010A, 1010B add margins to effectively eliminate any potential short circuits of the resistor of the invention. An open space between the sidewall spacers 1010A, 1010B may then be filled with additional polysilicon, which is planarized through conventional processes. The processing then continues similar to that shown in FIGS. 10-14, to form the structures of the present invention.

Figure 17:
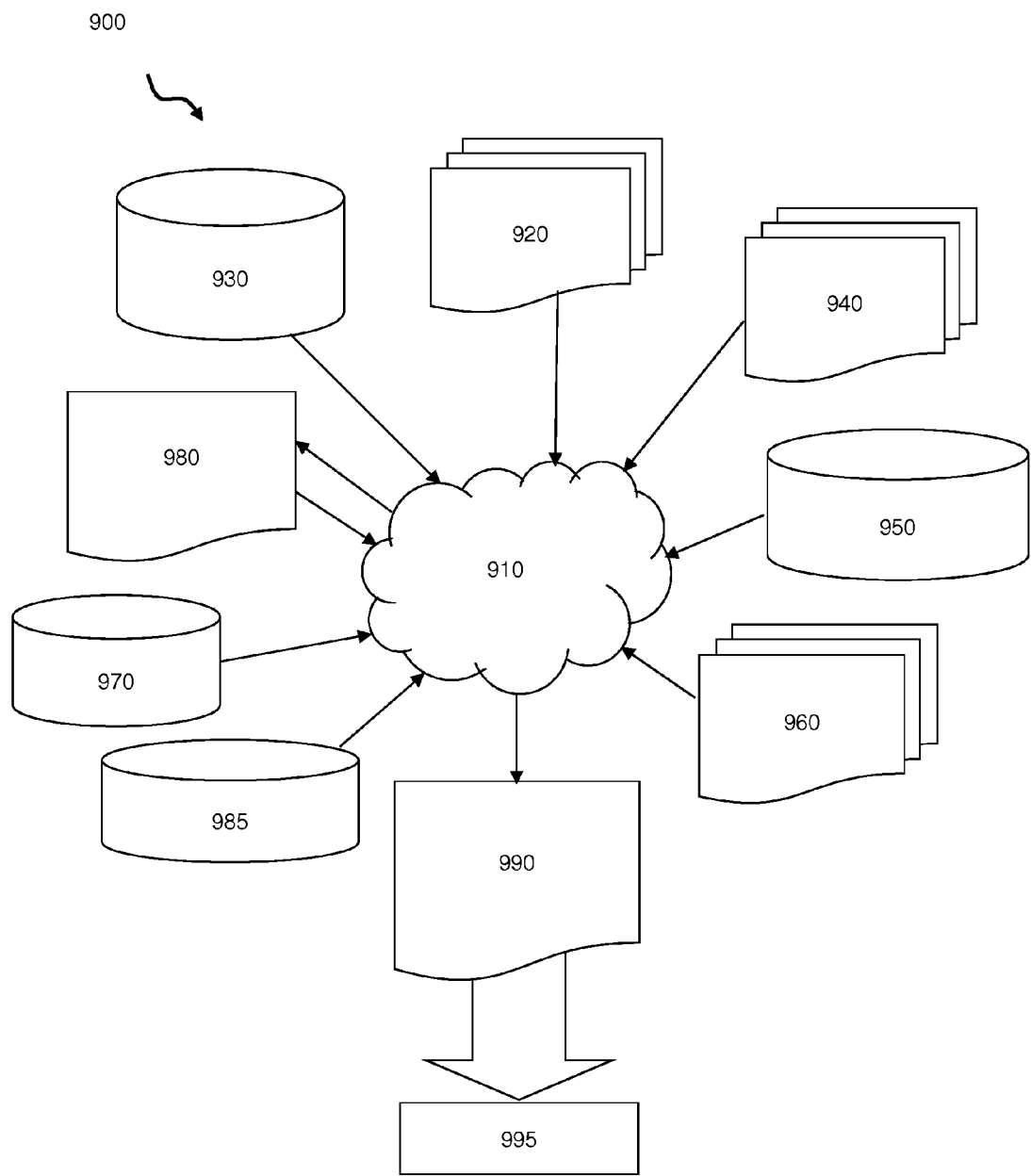
FIG. 17 is a flow diagram of a design process used in semiconductor design, manufacture, and/or test.

FIG. 17 is a flow diagram of a design process used in semiconductor design, manufacture, and/or test. FIG. 17 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-16. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-16. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-16 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-16. In one embodiment, design structure 990 may comprise a compiled, executable HDL simulation model that functionally simulates the devices shown in FIGS. 1-16.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-16. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a concentrically placed resistor and capacitor in a single trench structure, comprising:
   forming a deep trench through an STI structure and an underlying substrate;
   forming a first insulator material on a sidewall and bottom of the deep trench;
   forming a first electrode layer on the first insulator material, within the deep trench;
   forming a second insulator material on the first electrode layer;
   removing a portion of the second insulator material at a bottom of the deep trench to expose the first electrode layer;
   forming a second electrode layer in the deep trench on the second insulator material, and in electrical contact with the first electrode layer;
   forming a third insulator layer on the second electrode layer, in the deep trench; and
   forming a third electrode layer in the deep trench on the third insulator layer.

2. The method of claim 1, wherein the first electrode layer, the second electrode layer and the third electrode layer are polysilicon.

3. The method of claim 1, wherein the first insulator material, the first electrode layer, the second insulator material, the second electrode layer, the third insulator layer and the third electrode layer are recessed.

4. The method of claim 1, wherein the first electrode layer, the second electrode layer and the third electrode layer are concentrically formed.

5. The method of claim 1, wherein only a single deep trench is formed.

6. The method of claim 1, wherein the first insulator material, the first electrode layer, the second insulator material, the second electrode layer, the third insulator layer and the third electrode layer form a resistor and capacitor coaxially located with respect to one another, and the capacitor and the resistor are both electrically isolated from the underlying substrate.

7. The method of claim 1, wherein:
the first electrode layer and the second electrode layer are independent from each other; and
the second electrode layer is in electrical contact with the first electrode layer and the third electrode layer by an exposed portion of the first electrode layer in the deep trench.

8. The method of claim 1, wherein the forming of the first electrode layer, the second electrode layer and the third electrode layer comprises depositing one of a polysilicon material, a metal, and a metal silicide in the deep trench.

9. The method of claim 1, further comprising forming metal contacts on exposed regions of the first electrode layer and the third electrode layer.

10. The method of claim 1, wherein the STI structure is formed as a raised structure by removing layers of material around the STI structure.

11. The method of claim 1, further comprising etching a hole in the third electrode layer and filling the hole with dielectric material.

12. The method of claim 11, wherein a portion of the dielectric material is etched away to form sidewall spacers, which add margins to effectively eliminate any potential short circuits.

13. The method of claim 1, wherein the first electrode layer is formed with a slope on a shoulder portion of approximately 60°-80°.

14. The method of claim 13, wherein the second insulator material on the first electrode layer has a slope at or near the shoulder portion, such that the second insulator material is greater in thickness in its sloped region than in its vertical region.

* * * * *